United States Patent [19]

Naruse et al.

[11] Patent Number: 5,686,869
[45] Date of Patent: Nov. 11, 1997

[54] PULSE-WIDTH MODULATING DEVICE

[75] Inventors: Tetsuya Naruse, Chiba; Takehiro Sugita, Kanagawa; Tomoya Yamaura, Tokyo, all of Japan

[73] Assignee: Sony Corporation, Tokyo, Japan

[21] Appl. No.: 694,116

[22] Filed: Aug. 8, 1996

[30] Foreign Application Priority Data

Aug. 15, 1995 [JP] Japan .................................. 7-230785

[51] Int. Cl.$^6$ .............................. H03K 7/08; H03D 3/00; H04L 27/22
[52] U.S. Cl. ......................... 332/109; 329/300; 329/303; 375/206; 375/367
[58] Field of Search .............................. 332/109; 329/300, 329/303, 304, 310; 331/78; 375/206, 238, 367

[56] References Cited

U.S. PATENT DOCUMENTS 4,630,283  12/1986  Schiff .................................. 329/325 X
5,592,506  1/1997  Omura et al. ........................ 329/300 X Primary Examiner—David Mis
Attorney, Agent, or Firm—Jay H. Maioli

[57] ABSTRACT

A pulse-width modulating device comprises: a counter for generating a plurality of counter signals of n-bit, where n is an integer of 2 or more; a fundamental waveform generator for outputting a signal for the least significant bit of the count signal as the most significant bit of a fundamental waveform signal, obtaining a first product of inverted signals of all of the count signals for higher order bits than LSB, obtaining a second product of the first product and the count signal for a certain bit, carrying out this for every bit, and outputting n-bit fundamental waveform signals extending from the upper order bits to the lower order bits; and a pulse-width modulator for obtaining a product sum total for each bit of the n-bit data signal and each of the n-bit of fundamental waveform signals corresponding to the each bits of n-bit data and generating a pulse-width modulated signal, configured in such a manner that a pulse-width modulating signal having a pulse-width corresponding to the data signal and having a spectrum of a high frequency can be obtained.

4 Claims, 8 Drawing Sheets

PULSE-WIDTH MODULATING DEVICE

BACKGROUND OF THE INVENTION

The present invention relates to a pulse-width modulating device suitable for utilization in decoding of received signals for, for example, CDMA (Code Division Multiple Access) method portable telephones.

Currently, with CDMA portable telephones generating spread-spectrum signals using DS (Direct Sequence) format, spread modulation is performed by multiplying a digital signal having undergone primary modulation on the transmission side with code having a special waveform referred to as a PN (Pseudorandom Noise) series. On the other hand, on the receiving side, the spread-spectrum signal is demodulated to the original primarily modulated signal by multiplying the spread modulated received signal with a signal which is exactly the see as the PN-series code used in the spreading on the transmission side. At this time it is necessary on the receiving side to detect the frequency error between the demodulated signal and the received signal using the frequency error correction device so as to synchronize the timing of the generation of PN series code to be multiplied with the received signal with respect to the PN series code within the received signal.

As shown in FIG. 1, at the frequency error correcting device 1, the timing of the generation of PN code at the PN code generator 3 is decided by the clock CLK1 outputted from the voltage-controlled crystal oscillator (VCXO) 2 whose oscillating frequency is controlled by a voltage applied thereto. Frequency-error-corrected PN code PN is supplied to a multiplier 4 from the PN code generator 3. The multiplier 4 performs an exclusive OR operation on the PN code PN with respect to the received signal $S_R$, decodes the received signal $S_R$ and sends the decoded signal to a frequency error detector 5. The frequency error detector 5 sends a detection signal $S_{DT}$ to the pulse-width modulator (PWM) 6 when a frequency error is detected. The PWM 6 then generates a PWM signal p by pulse-width modulating the transmitted detection signal $S_{DT}$.

The PWM signal p generated at the PWM 6 includes an amount of error as an amount of d.c. component. The PWM signal p is then sent to a low-pass filter (LPF) 7 and the d.c. component taken as the amount of error is extracted. The d.c. component obtained from the LPF 7 is sent to the voltage-controlled crystal oscillator 2 as a control signal $S_{CT}$ and the oscillating frequency of the clock CLK1 transmitted to the PN code generator 3 is corrected in accordance with the amount of error.

FIG. 2 shows a specific configuration for the PWM 6. The PWM 6 continuously changes the pulse width in response to changes in the amplitude of the modulation signal. The PWM 6 sends an n-bit binary count signal c ($c_1$ to $c_n$) having a period that is a multiple of that of the operating clock CLK2 inputted to the n-bit binary counting circuit 9 to a fundamental waveform generating circuit 10.

The fundamental waveform generating circuit 10 generates n fundamental waveforms a ($a_1$ to $a_n$) used in PWM waveform generation from the binary count signals $c_1$ to $c_n$ and sends these fundamental waveforms in parallel to a PWM waveform generating circuit 11. The fundamental waveform a is a waveform capable of being pulse-width modulated by the products of each of the bits for the data signal $S_D$ corresponding to the detection signal $S_{DT}$ shown in FIG. 1. The PWM waveform generating circuit 11 generates a pulse-width-modulated PWM signal p using the fundamental waveforms $1a$ to an inputted as being n bits and the data signal $S_D$ inputted in parallel as being n bits.

The count signals $c_1$ to $c_n$ corresponding to the n-bits from the least significant bit (LSB) to the most significant bit (MSB) are inputted at the fundamental waveform generating circuit 10 shown in FIG. 3 and the fundamental waveform signals $a_1$ to an used in PWM are correspondingly outputted to these signals in such a manner as to range from the LSB to the MSB. FIG. 4 shows the waveforms for one period of the four-bit binary count signals $c_1$ to $c_4$. FIG. 5 shows the waveforms for one period of the fundamental waveform signals $a_1$ to $a_4$ used in PWM waveform generation. These fundamental waveform signals are obtained by combining the aforementioned binary count signals $c_1$ to $c_4$ at the fundamental waveform generating circuit 10. The time ratios for the high levels "Hi" to the low levels "Lo" of these fundamental waveform signals is, for example, 1:1 for $a_4$, and 1:3, 1:7 and 1:15 for $a_3$, $a_2$ and $a_1$ respectively. There are no cases where the "Hi"'s of each of the fundamental waveform signals $a_1$ to $a_4$ are overlapped with respect to time.

The PWM signal p comprises signals $P_1$ to $P_m$ with $m=2^n$ waveform types which correspond to the bit number n of the data signal $S_D$. FIG. 6 shows the PWM signal p after pulse-width modulation of the four-bit data signal $S_D$ and PWM signals with $2^4=16$ waveform types are generated as $P_1$ to $P_{16}$ correspondingly to binary data signals $S_D$ of [0000] to [1111] that are inputted in parallel. For example, for the data signal $S_D$ being [0101] (arranged from LSB to MSB in the leftward direction), the PWM signal $P_6$ is outputted by combining the fundamental waveform signals $a_1$ and $a_3$.

However, at the pulse-width modulating device 1 as described above, the PWM waveform has a spectrum of a low frequency. Therefore, the low-pass filter causes a great deal of loss of the d.c. component of the PWM waveform. It is also not possible to raise the cut-off frequency of the low-pass filter because the low frequency band component is left in the PWM waveform.

In order to take into consideration the above points, the present invention proposes a pulse-width modulating device for generating a PWM waveform having a high-frequency spectrum.

SUMMARY OF THE INVENTION

In order to resolve the aforementioned points, according to the present invention, a pulse-width modulating device comprises a counter, a fundamental waveform generator, and a pulse-width modulator. The counter is for generating a plurality of counter signals of n-bit, where n is an integer of 2 or more. The fundamental waveform generator outputs a signal for the least significant bit of the count signal as the most significant bit of a fundamental waveform signal, obtains a first product as a product of inverted signals of all of the count signals for lower order bits than a certain bit with regards to the count signals for higher order bits than the least significant bit of the count signal, obtains a second product of the first product and the count signal for the certain bit as a fundamental waveform signal, carries out above obtaining procedure for every bit, and outputs n-bit fundamental waveform signals extending from the upper order bits to the lower order bits. The pulse-width modulator is for obtaining a product sum total for each bit of the n-bit data signal and each of the n-bit of fundamental waveform signals corresponding to the each bits of n-bit data and generating a pulse-width modulated signal.

Further, the fundamental waveform generator can comprise a first output terminal, a plurality of NOT elements, a plurality of AND elements and second to nth terminals. The first output terminal is for outputting the most significant bit of the fundamental waveform signal. The plurality of NOT elements are for respectively generating the inverted signals for the count signals for lower order bits than the most significant bit of the count signal. The plurality of AND elements are for obtaining the first product of inverted signals generated from the NOT elements corresponding to all of lower order bits than a certain bit of the bits for the count signal and obtaining the second product of the first product and the count signal for the certain bit. The second to nth output terminals are for outputting an output signal supplied from the plurality of AND elements.

Moreover, the AND elements can comprise a plurality of first AND elements for obtaining a product of inverted signals from the NOT elements and a plurality of second AND elements each for obtaining a product of the inverted signals and the count signal for the bit.

Still further, the pulse-width modulating device of the present invention can utilize a part of the dynamic range of the data signal to generate the pulse-width modulation waveform signal.

A pulse-width-modulating signal having a high-frequency spectrum can therefore be generated by pulse-width-modulating the data signal by performing product and sum operations between fundamental waveform signals having a generated characteristic spectrum of a high frequency.

DETAILED DESCRIPTION OF THE PREFERRED EMBODIMENTS

First Embodiment

An embodiment of the present invention is described in the following with reference to the drawings.

(1) Configuration of frequency error correction device.

Figure 1:
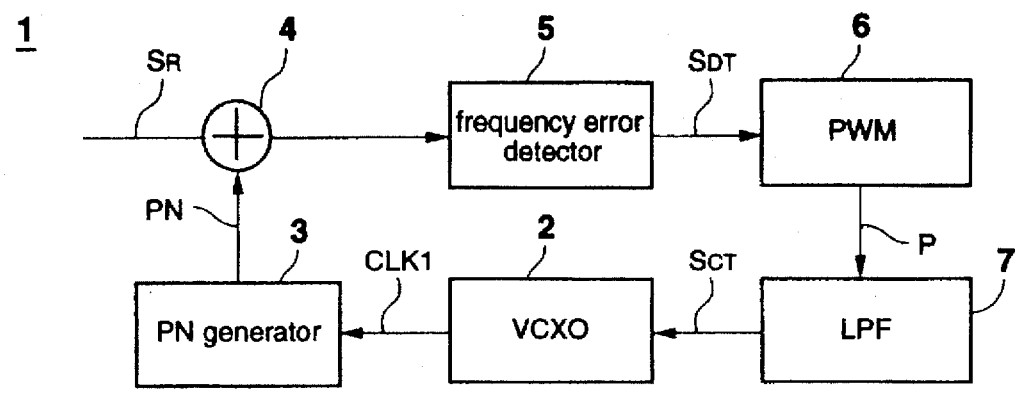
FIG. 1 is a block diagram showing the configuration of a frequency error correction device of the related art.
Figure 7:
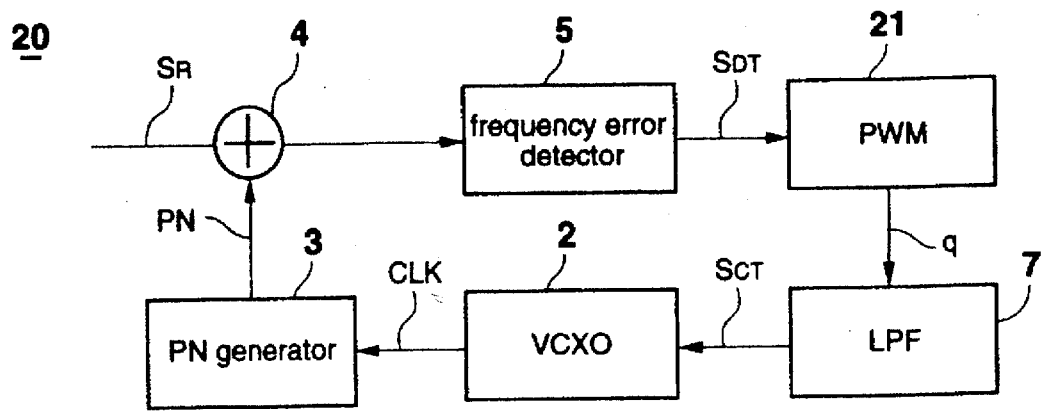
FIG. 7 is a block diagram showing the overall configuration of a frequency error correction device of an embodiment of the present invention.

In FIG. 7, wherein parts corresponding to those in FIG. 1 are designated with the same numerals, numeral 20 denotes a frequency error correcting device. The timing of generation of PN code at a PN code generator 3 is decided by the clock CLK1 outputted from the voltage-controlled crystal oscillator (VCXO) 2 whose oscillating frequency is controlled by a voltage applied thereto. PN code PN from the PN code generator 3 with frequency errors corrected is then sent to a multiplier 4. The multiplier then decodes a received signal $S_R$ by performing an exclusive OR operations on the received signal $S_R$ with the PN code PN, with the decoded signal being sent to a frequency error detector 5. The frequency error detector 5 then sends a detection signal $S_{DT}$ to a PWM 21 when a frequency error is detected. The PWM 21 then outputs a PWM signal q by pulse band-modulating the detection signal $S_{DT}$. The PWM signal q becomes m=$2^n$ types waveform signals according to the bit number n of the n-bit data signal $S_p$.

The PWM signal q generated at the PWM 21 includes an amount of error as an amount of d.c. component. This PWM signal q is then sent to an LPF 7 for extracting a d.c. component as the amount of error. The d.c. component obtained from the PLF 7 is sent to the voltage-controlled crystal oscillator 2 a control signal $S_{CT}$ and the oscillating frequency of the clock CLK1 sent to the PN code generator 3 is corrected in accordance with the amount of error.

Figure 8:
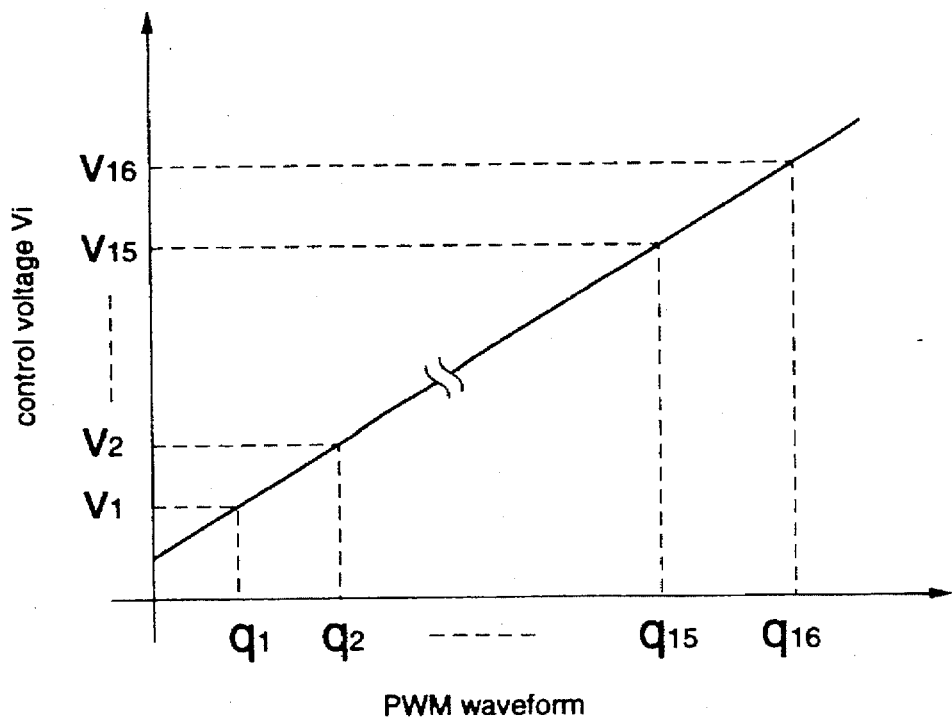
FIG. 8 is a graph showing the relationship of the pulse-width modulated waveform and the control voltage.

FIG. 8 is a graph showing the relationship between the PWM signal q inputted to the LPF 7 in FIG. 7 and the control voltage of the control signal $S_{CT}$ for controlling the frequency of voltage-controlled crystal oscillator 2 outputted from LPF 7. According to this graph, when the PWM signal is, for example, q2, it is shown that the voltage VT of the control signal $S_{CT}$ outputted from LPF 7 becomes V2.

(2) Configuration of pulse-width modulator.

Figure 2:
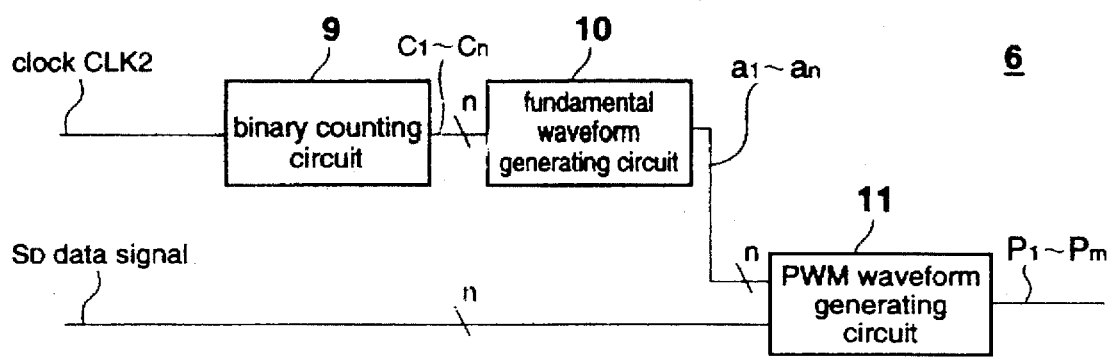
FIG. 2 is a block diagram showing the configuration of a pulse-width modulating device of the related art.
Figure 3:
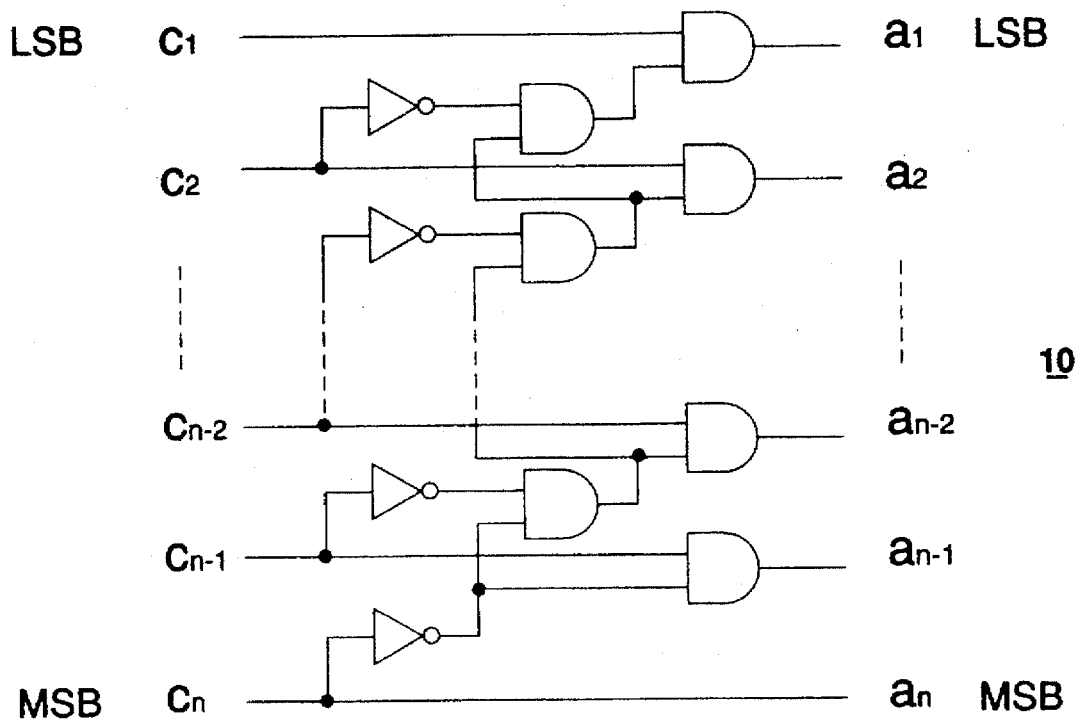
FIG. 3 is a schematic diagram showing the configuration of a fundamental waveform generating circuit of the related art.
Figure 4:
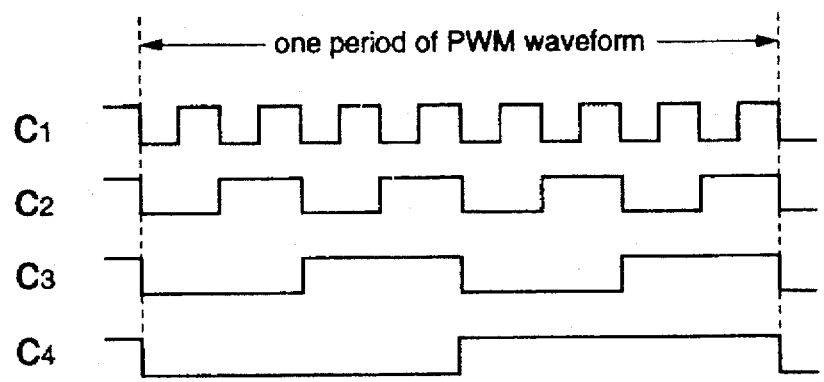
FIG. 4 is a waveform diagram of a four-bit count signal.
Figure 5:
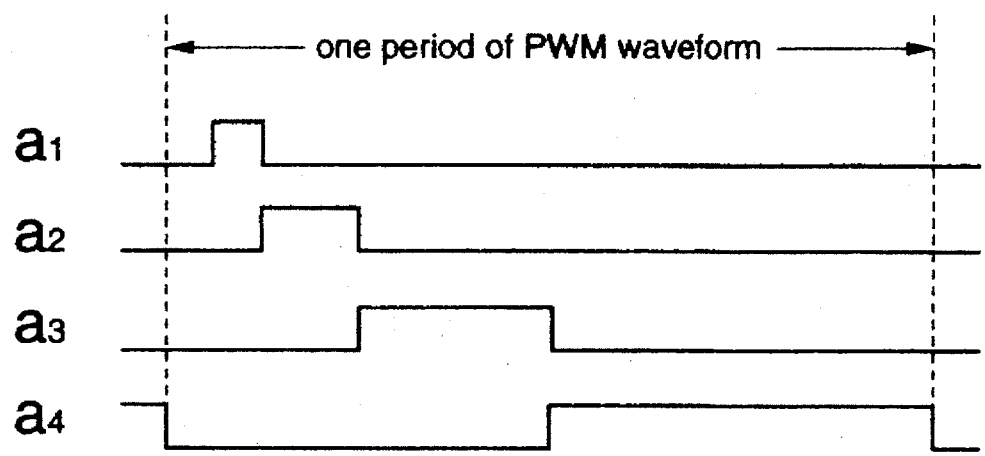
FIG. 5 is a waveform diagram of a fundamental waveform signal of the related art.
Figure 6:
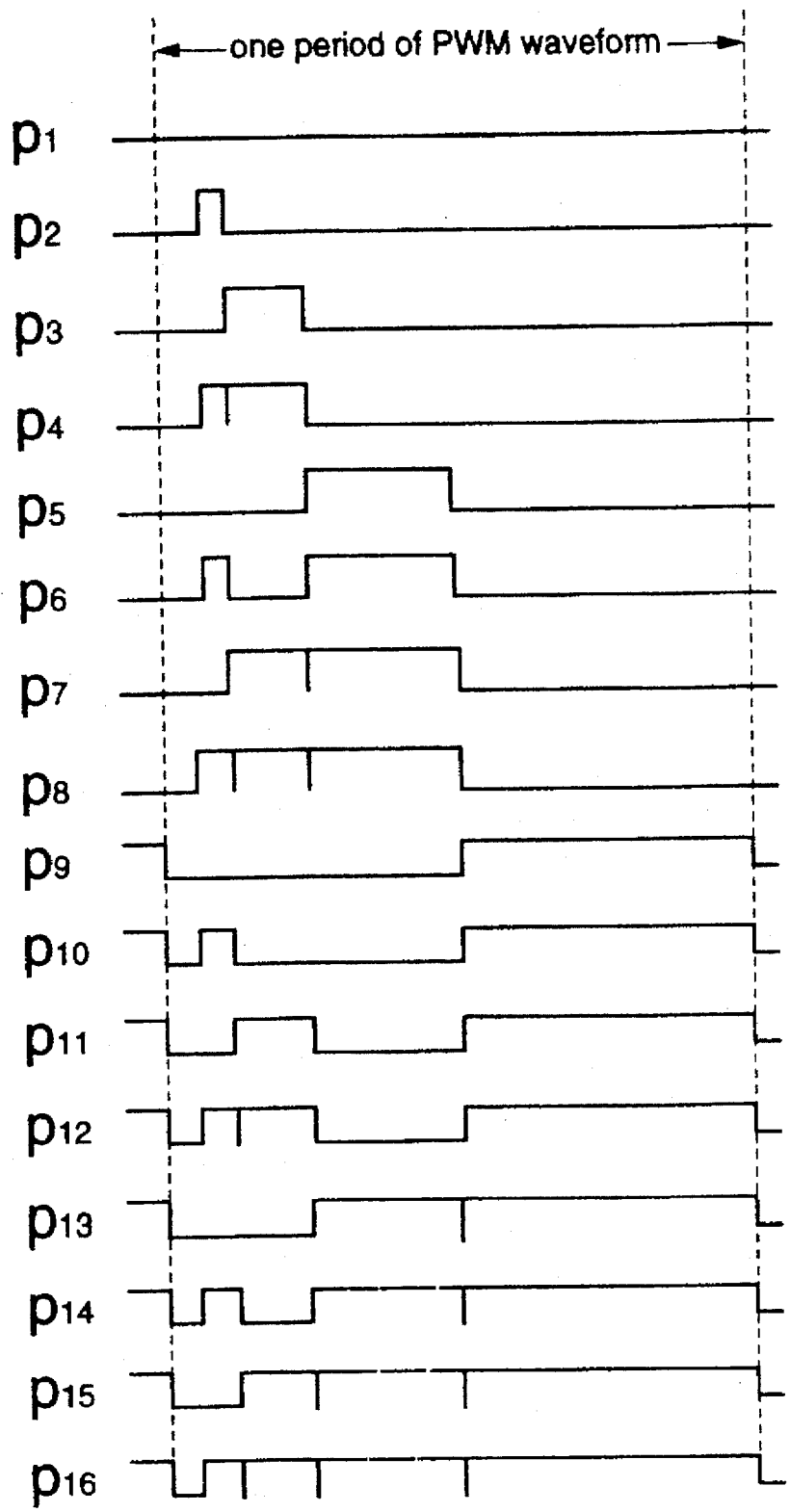
FIG. 6 is a diagram of pulse-width modulated waveforms of the related art.
Figure 9:
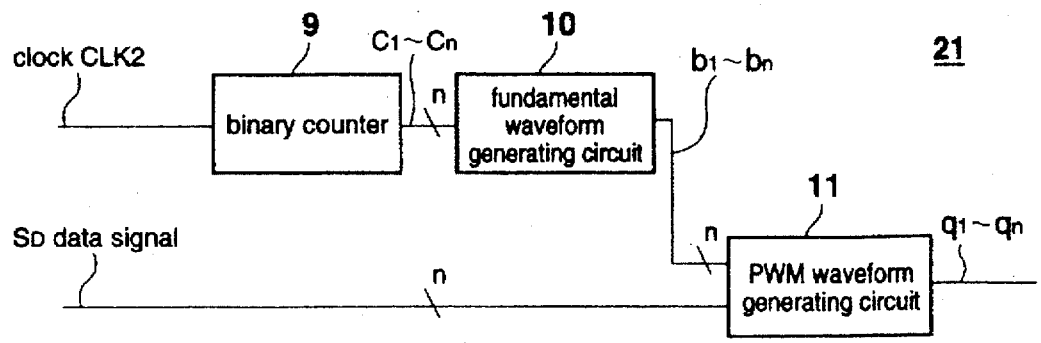
FIG. 9 is a block diagram showing the overall configuration of a pulse-width modulation device of the present invention.

In FIG. 9, wherein parts corresponding to those in FIG. 2 are designated with the same numerals, numeral 25 denotes a specific configuration of the PWM 21. A binary counter 9 generates n-bit binary count signals c ($c_1$ to $c_n$) having multiplied periods of the inputted operating clock CLK2 and sends the signals c to a fundamental waveform generator 26. The fundamental waveform generating circuit 26 generates n fundamental waveforms b ($b_1$ to $b_n$) used for generating PWM waveforms from the binary count signals $c_1$ to $c_n$ and sends these fundamental waveforms in parallel to a PWM waveform generating circuit 11. The PWM waveform generating circuit 11 generates the pulse-width modulated PWM waveforms q from the fundamental waveforms b inputted as n bits and the data signal $S_D$ (corresponding to the detection signal $S_{DT}$ shown in FIG. 7) inputted in parallel as n bits and outputs the waveforms q.

Figure 10:
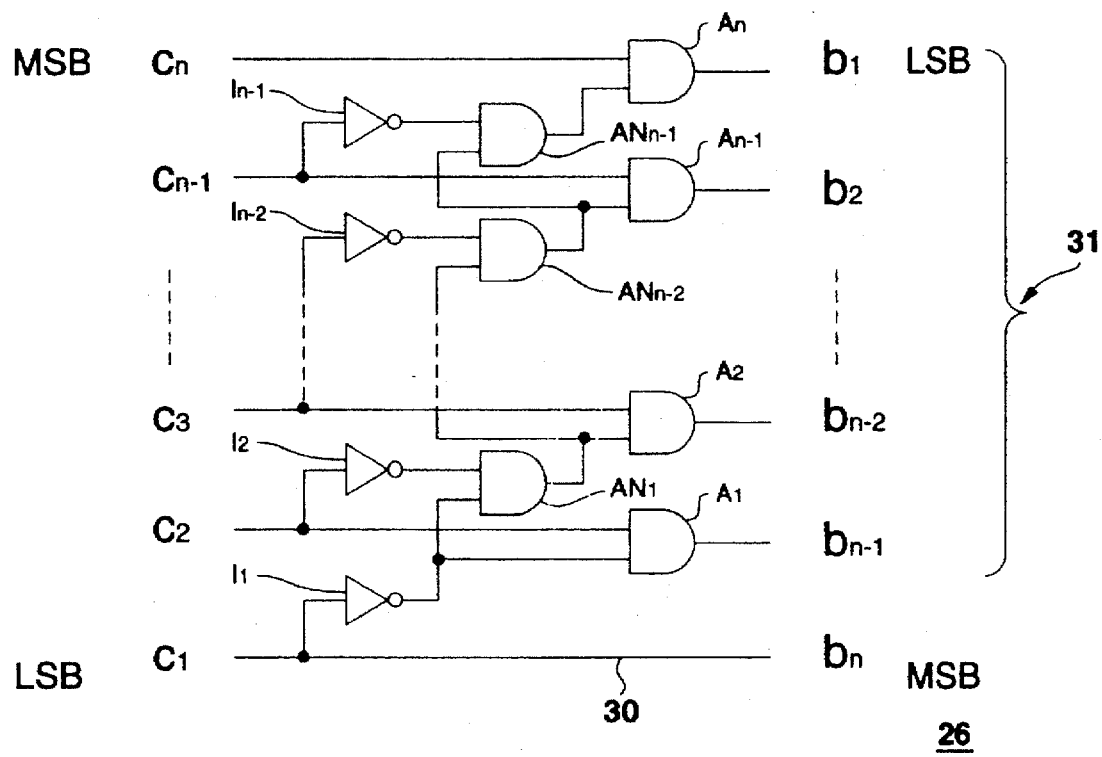
FIG. 10 is a schematic diagram showing the configuration of a fundamental waveform generator of the present invention.

As shown in FIG. 10, the fundamental waveform generating circuit 26 first outputs a binary count signal $C_1$, which is at the least significant bit (LSB) of the binary count signal c, as the fundamental waveform signal bn, which is at the most significant bit (MSB) of the fundamental waveform signal to the first output part 30 without modification. Next to this, the product of the inverted signal of the binary count signal $c_1$, that is inverted by the NOT gate $I_1$, and the binary count signal $c_2$ is outputted from an AND gate $A_1$ as the fundamental waveform $b_{n-1}$ which is one bit lower with respect to the fundamental waveform signal $b_n$ being at the MSB.

Following this, the two inverted signals of the binary count signals $c_1$ and $c_2$, which are inverted by the NOT gate $I_1$ and the NOT gate $I_2$, are inputted to an AND gate $AN_1$ and the product of these two inverted signals is calculated. The product of the binary count signals $c_3$ being at the upper bit and the output from the AND gate $AN_1$ is then calculated by an AND gate $A_2$ and outputted as the fundamental waveform $b_{n-2}$.

To generate the fundamental waveform signal b, all of the inverted outputs of the binary count signals being at the lower bits with respect to the prescribed binary count signal c are first calculated out by the NOT gate I. The product of all of these inverted outputs is then calculated by AND gates AN from the least significant bit onwards. Next, the prescribed binary count signal c and the product of all of the inverted outputs up to the bit one order low from that of the binary count signal c are calculated by the respective AND gates A. The fundamental waveform signals $b_n$ to $b_1$ from the MSB to the LSB corresponding to the binary count signals $c_1$ to $c_n$ from the LSB to the MSB are thus sequentially outputted from a first output part 30 and a second output part 31 comprising AND gates $A_1$ to $A_N$.

With regards to all of the bits, the fundamental waveform signal b is formed using a pulse having the same width as that of the pulse comprising the binary count signal $c_1$ for the LSB with the highest frequency. The fundamental waveform signals $b_1$ to $b_n$ therefore have a spectrum of a high frequency. A general equation for extracting the fundamental waveforms $b_1$ to $b_n$ from the binary count signal $c_1$ to $c_n$ is expressed by the following equation.

$$b_i = C_{n+1-i} \cdot \prod_{j=1}^{n-1} \overline{C_j} \text{ for } i = 1, \ldots n-1$$

and $$b_i = C_j \text{ for } i = n.$$

for i–1, ... n–1 and $b_i = C_1$ for i=n.

Figure 11:
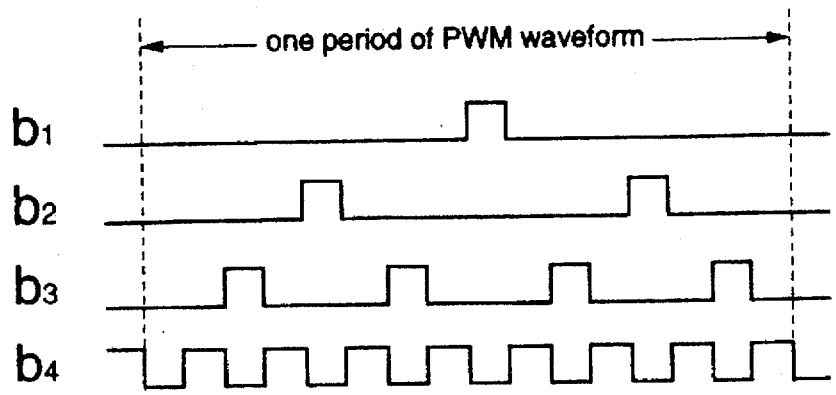
FIG. 11 is a waveform diagram of the fundamental waveform signals of the present invention.

FIG. 11 shows waveforms in one period of the fundamental waveforms $b_1$ to $b_4$ from the LSB to the MSB when the binary count signal is taken as a four bit signal. The time ratios for "Hi" and "Lo" at the fundamental waveform signal $b_4$ being at the MSB is 1:1, while at the fundamental waveform signals $b_3$, $b_2$ and $b_1$ at the LSB these ratios become 1:3, 1:7 and 1:15. Moreover, the "Hi" portions for each of the waveforms do not overlap with respect to time. Fundamental waveform signals $b_1$ to $b_4$ having a high-frequency spectrum of a narrow pulse-width can therefore be generated.

Figure 12:
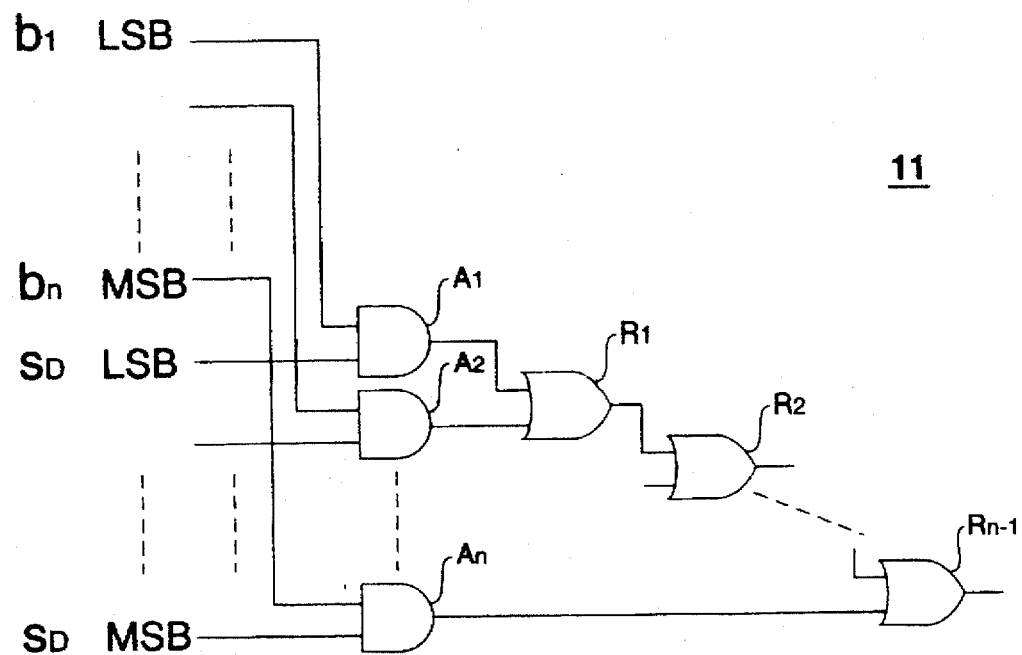
FIG. 12 is a schematic diagram showing the configuration of a PWM waveform generator of the present invention.

The PWM waveform generating circuit 11 shown in FIG. 12 makes the fundamental waveform signals $b_1$ to $b_n$ from the LSB to the MSB and the data signals $S_D$ from the LSB to the MSB correspond to each other and inputs these as two input values to the AND gates $A_1$ to $A_n$. As a result, respective products of corresponding bits of the fundamental waveform signals $b_1$ to $b_n$ and the data signal $S_D$ from the LSB to MSB are outputted from the AND gates $A_1$ to $A_n$. The PWM signal q corresponding to the data signal $S_D$ can then be generated by obtaining the total of the output values of the AND gates $A_1$ to $A_n$ using the OR gates $R_1$ to $R_{n-1}$ connected in the way shown in FIG. 12.

Figure 13:
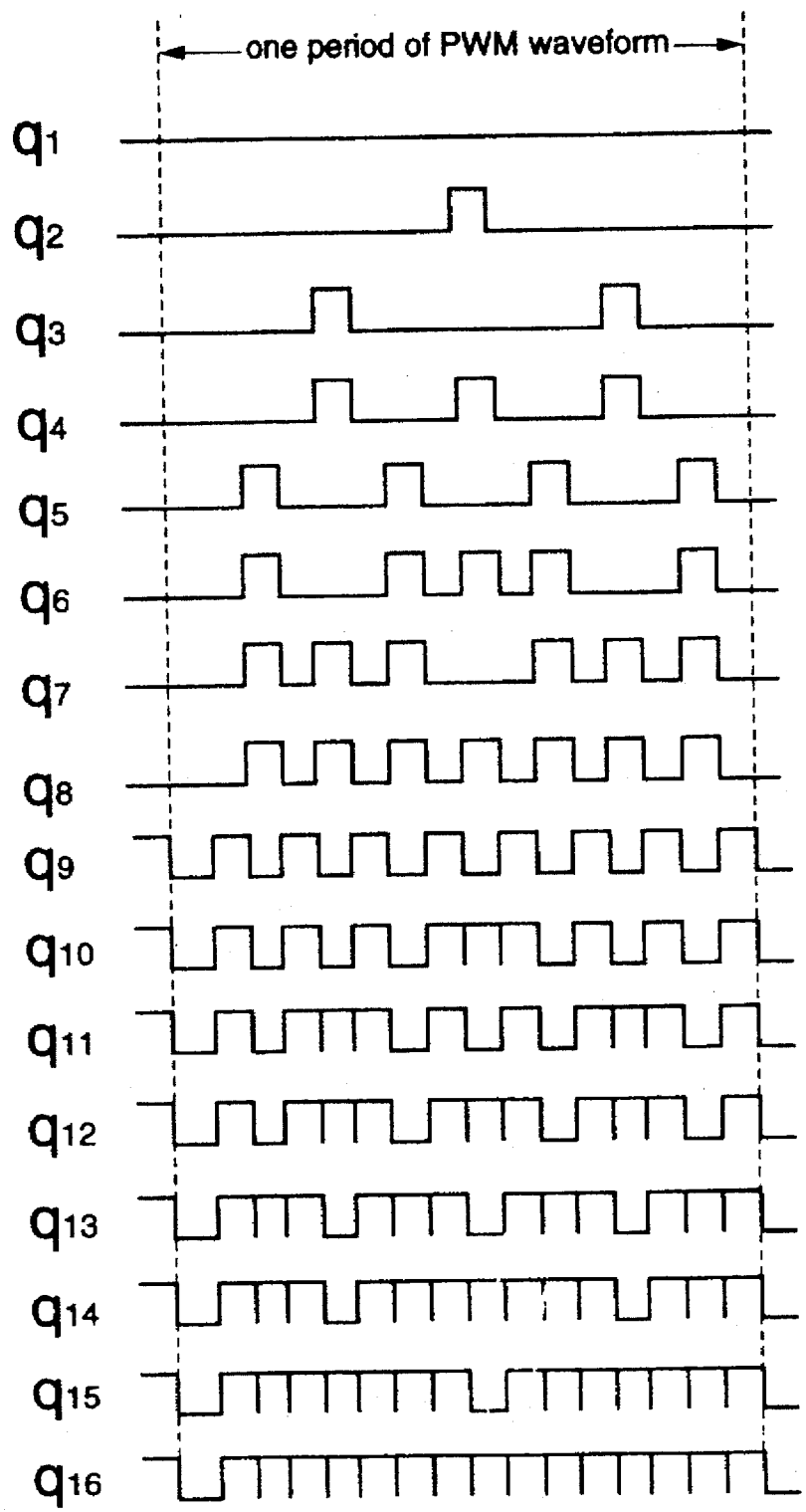
FIG. 13 is a diagram of the pulse-width-modulating waveforms of the present invention.

FIG. 13 shows the PWM waveforms $q^1$ to $q^{16}$ after pulse wave modulation of the data signal $S_D$, for which the bit number for the data signal $S_D$ is taken to be four bits and the data range is therefore $2^4=16$. The PWM signals $q^1$ to $q^{16}$ correspond to the parallel inputted binary data signals $S_D$ [0000] to [1111]. For example, when the data signal $S_D$ is [0101] (arranged from LSM to MSB in the leftward direction), the fundamental waveform signal $b_1$ for the LSB and the fundamental waveform signal $b_3$ for the third digit are combined and the resulting PWM signal $q^6$ is outputted.

The PWM waveforms $q^1$ to $q^{16}$ are generated by using fundamental waveform signals which comprise narrower pulses with higher possible frequency when compared with those in the related art. The cut-off frequency of the LPF 7 can therefore be raised using, for example, the PWM signals $q^4$ to $q^{13}$ etc. being a part of the PWM waveforms as the PWM signal q.

As a result, a fundamental waveform signal b comprised of pulses with a narrow pulse-width having a high-frequency spectrum can be generated at the PWM waveform generating circuit 11 an a PWM signal q can be outputted as having a narrow pulse width where "Hi" states do not continue for long. The pulse-width of the waveform for the PWM signal q can therefore be made small without changing the operating clock of the count circuit and increasing the scale of the device. The high frequency component of the PWM signal can therefore be shifted to a higher frequency region and d.c. component loss due to the LPF 7 of the PWM signal can be kept small.

Further, when the dynamic range of the data signal $S_D$ to be pulse-width-modulated is narrow, the PWM signal having a higher frequency spectrum is made to correspond to the narrower dynamic range of the data signals $S_D$ and the cut-off frequency of the LPF 7 for the frequency error correction device 20 can be set to be higher. Therefore, the d.c. component loss can be removed to an even greater extent.

In the above configuration, the received signal $S_R$ is decoded by exclusive OR operations with the PN code PN at the multiplier 4 and the demodulated signal is sent to the frequency error detecting circuit 5. The detection signal $S_{DT}$ due to the frequency error detected at the frequency error detecting circuit 5 is sent to the PWM 21. At the PWM 21, n-bit binary count signals $c_1$ to $c_n$ are generated on the basis of the operating clock CLK2 at the binary counter 9 and sent in parallel to the fundamental waveform generating circuit 26.

The fundamental waveform generating circuit 26 first sequentially calculates the inverted outputs for the binary count signal c comprising the lower order bits of the prescribed binary count signal c. A fundamental waveform signal b corresponding to a prescribed binary count signal c is generated by calculating the product for all of these inverted outputs and getting the product between this product and the prescribed binary count signal c. As a result, the binary count signal for the lower bits having a high frequency spectrum is used to compose all of the fundamental waveform signal b.

In this way, the fundamental waveform generating circuit 26 generates n kinds of fundamental waveforms $b_1$ to $b_n$ used in the PWM waveform generation from the binary count signals $c_1$ to $c_3$ and sends the fundamental waveforms in parallel to the PWM waveform generating circuit 11. The PWM waveform generating circuit 11 then makes the fundamental waveform signals $b_1$ to $b_n$ from the LSB to the MSB and the data signals $S_D$ for the LSB to the MSB correspond to each other and calculates and outputs the product of corresponding signals for every bit. The PWM waveforms $q^1$ to $q^m$ corresponding to the data signals $S_D$ are then generated by getting the total sum of the outputted products.

A pulse-modulated PWM signal q having a spectrum of a high frequency is outputted from the PWM 21. The PWM signal q is then sent to the voltage-controlled crystal oscillator 2 via the LPF 7 and the oscillating frequency of the clock CLK1 sent to the PN code generator 3 is corrected.

According to the above configuration, the fundamental waveform signal b is generated by performing product and sum operations on the binary count signals c generated by multiplying the operating clock CLK2 in the binary counting circuit 9. In these product and sum operations, the binary count signals with a high frequency are inverted sequentially from the LSB to upper bit and from the sum of the products of all of the inverted outputs and the prescribed binary count signal c the fundamental waveform signal b is generated. The fundamental waveform signal b generated in this way can therefore be made to have a high-frequency spectrum.

A PWM signal q having a narrow pulse-width for which a "Hi" state does not continue for a long time and which has a high frequency spectrum can therefore be generated by the PWM waveform generating circuit 11 and the frequency component of the PWM signal can be shifted to a higher frequency region. The pulse-width of the PWM signal q can therefore be made short without changing the operating clock CLK2 of the counting circuit or increasing the scale of the device. The d.c. component loss of the PWM signal due to the LPF 7 can therefore be reduced as a result.

According to the present invention, PWM signals having a higher frequency spectrum, for example, $q^4$ to $q^{13}$ are used correspondingly to the narrower dynamic range of the data signal $S_D$. Because of this, the cut-off frequency of the LPF 7 for generating the control voltage $S_{CT}$ for the frequency error correction device 20 can be raised and d.c. component losses of the PWM signal can be made to be much lower.

In the above embodiment, a description was given of the case of decoding of received signals in CDMA method portable telephones but the present invention is by no means limited in this respect and may be used in a wide range of general pulse-width modulation.

According to the present invention, a counter generates count signals of n-bit, and a fundamental waveform generating circuit outputs a signal for the least significant bit of the count signal as the most significant bit of a fundamental waveform signal, obtains a first product as a product of inverted signals for all of the count signals for lower order bits than a certain bit with regard to the count signals for higher order bits than the least significant bit of the count signal, obtains a second product of the first product and the count signal for the certain bit as a fundamental waveform signal carries out above obtaining procedure for every bit, and outputs n-bit fundamental waveform signals extending from the upper order bits to the lower order bits. As a result, an n-bit fundamental waveform signal having a spectrum of a high frequency is generated and the product of each bit of this n-bit fundamental waveform signal and each bit of the n-bit data signal corresponding to these bits is obtained. A pulse-width modulating signal having a pulse-width corresponding to the data signal and having a high frequency spectrum can then be obtained by adding these products.

What is claimed is:

1. A pulse-width modulating device comprising:
    a counter for generating a plurality of counter signals of n-bit, where n is an integer of 2 or more;
    fundamental waveform generating means, said means outputting a signal for the least significant bit of said count signal as the most significant bit of a fundamental waveform signal, obtaining a first product as a product of inverted signals of all of said count signals for lower order bits than a certain bit with regards to said count signals for higher order bits than the least significant bit of said count signal, obtaining a second product of said first product and said count signal for said certain bit as a fundamental waveform signal, carrying out above obtaining procedure for every bit, and outputting n-bit fundamental waveform signals extending from said upper order bits to said lower order bits; and
    pulse-width modulating means for obtaining a product sum total for each bit of the n-bit data signal and each of said n-bit of fundamental waveform signals corresponding to said each bits of n-bit data and generating a pulse-width modulated signal.

2. A pulse-width modulating device according to claim 1, wherein said fundamental waveform generating means comprises:
    a first output terminal for outputting the most significant bit of said fundamental waveform signal;
    a plurality of NOT elements for respectively generating the inverted signals for said count signals for lower order bits than the most significant bit of said count signal;
    a plurality of AND elements for obtaining said first product of inverted signals generated from said NOT elements corresponding to all of lower order bits than a certain bit of the bits for said count signal and obtaining said second product of said first product and said count signal of said certain bit; and
    second to nth output terminals for outputting an output signal supplied from said plurality of AND elements.

3. A pulse-width modulating device according to claim 2, wherein a plurality of said AND elements comprise:
    a plurality of first AND elements for obtaining a product of inverted signals from said NOT elements; and
    a plurality of second AND elements each for obtaining a product of said inverted signals and said count signal for said bit.

4. A pulse-width modulating device according to claim 1, wherein said pulse-width modulation waveform signal is generated by utilizing a part of the dynamic range of said data signal.

* * * * *